United States Patent [19]

Green, Jr.

[11] Patent Number: 4,807,167

[45] Date of Patent: Feb. 21, 1989

[54] RAPID METHOD OF DIGITAL AUTOMATIC GAIN CONTROL

[75] Inventor: Ben A. Green, Jr., Schenectady, N.Y.

[73] Assignee: General Electric Company, Schenectady, N.Y.

[21] Appl. No.: 27,367

[22] Filed: Mar. 18, 1987

[51] Int. Cl.⁴ .................. H03G 3/20; G01L 25/00; G01P 21/00

[52] U.S. Cl. ................ 364/571.04; 330/284; 340/683; 364/508

[58] Field of Search .......... 364/571, 715, 508, 507, 364/474; 340/683, 660; 330/284, 144, 145

[56] References Cited

U.S. PATENT DOCUMENTS

| | | | |
|---|---|---|---|
| 3,277,438 | 10/1966 | Ford et al. | 367/65 |
| 3,860,168 | 1/1975 | Byrd et al. | 364/300 |
| 4,028,534 | 6/1977 | Tucker | 330/145 |
| 4,276,604 | 6/1981 | Kitamura et al. | 330/284 |
| 4,334,185 | 6/1982 | Turney et al. | 330/284 |
| 4,365,514 | 12/1982 | Ho | 73/592 |
| 4,463,320 | 7/1984 | Dawson | 330/284 |
| 4,514,797 | 4/1985 | Begin | 364/148 |
| 4,563,897 | 1/1986 | Moore | 73/587 |
| 4,631,683 | 12/1986 | Thomas et al. | 364/474 |
| 4,634,997 | 1/1987 | Tompsett et al. | 330/284 |
| 4,636,779 | 1/1987 | Thomas et al. | 340/680 |
| 4,636,780 | 1/1987 | Thomas et al. | 340/680 |
| 4,642,617 | 2/1987 | Thomas et al. | 340/680 |
| 4,707,688 | 11/1987 | Thomas | 340/680 |
| 4,724,524 | 2/1988 | Thomas et al. | 364/474 |
| 4,736,625 | 4/1988 | Patterson et al. | 73/104 |

Primary Examiner—Parshotam S. Lall
Assistant Examiner—S. A. Melnick
Attorney, Agent, or Firm—Donald R. Campbell; James C. Davis, Jr.; Paul R. Webb, II

[57] ABSTRACT

A method of digital automatic gain control does the required circulation without numerical multiplication or division and makes possible fast process control using a digital AGC. A signal channel has a digitally programmable variable gain device such as a multiplying digital-to-analog converter; the gain control input of the variable gain device is adjusted periodically to keep the exponential average of the digitized channel output signal with a given time constant at a desired average signal level. For instance, the vibration signal generated by a cutting process is held at a desired average prior to vibration pattern analysis to detect tool breakage and tool touch to a workpiece.

16 Claims, 3 Drawing Sheets

A, B = INTEGER VARIABLES A AND B
X = DIGITIZED CHANNEL OUTPUT SIGNAL
L = DESIRED AVERAGE OUTPUT SIGNAL LEVEL
T = TIME-CONSTANT
N = INTEGER AMOUNT BY WHICH GAIN IS CHANGED
G = DIGITAL GAIN

RAPID METHOD OF DIGITAL AUTOMATIC GAIN CONTROL

BACKGROUND OF THE INVENTION

This invention relates to digital automatic gain control and especially to achieving speed sufficient for real-time signal processing.

Automatic gain control of a process variable is the adjustment of the system gain, a multiplier, so as to keep constant a long-term average of the value of a process variable. It has long been used in radio communication receivers to control the loudness of the output sound. Digital automatic gain control has advantages over analog methods but has been limited in use because the calculations involved have required more time than can be afforded in fast, real-time process control. In particular, the calculations have been thought to require multiplication and division steps, which are much slower than addition and subtraction. A method of calculation that avoids multiplication and division would make digital AGC feasible in areas of process control in which it is not feasible otherwise.

Well known analog methods of automatic gain control involve the averaging of the signal or process variable to be controlled by means of a low-pass filter and utilization of this average to adjust the system gain through some kind of level-adjusting component. With the introduction of the multiplying digital-to-analog converter (MDAC), it has become possible to achieve automatic gain control digitally. The digital form of low-pass filtering is known to be exponential averaging. The exponential average of a signal sampled repeatedly can be tracked over time by accumulating the difference between the current signal and the previous value of the average and dividing the result by a chosen time constant. The result is the updated value of the exponential average. To regulate that average to a desired level, the gain is adjusted proportionally as follows: new gain is to old gain as the desired level is to the current average. After any possible combination of steps, calculation of new gain by this method can be shown to require at least one division and one multiplication per sampling cycle.

One application of a fast digital AGC is in a Machine Tool Monitor to adjust a vibration signal to a chosen average level; the signal is then analyzed to detect acoustic signatures characteristic of tool breakage and initial touch of the cutting tool to a workpiece. A number of commonly assigned patents and copending applications cover various aspects of the MTM. Among the latter that are relevant to this invention and which disclose a digitally programmable multiplying digital-to-analog converter in the analog signal channel to preprocess the vibration signal prior to digitization are: Ser. No. 744,083, filed June 12, 1985 now U.S. Pat. No. 4,724,524, C. E. Thomas et al, "Vibration-Sensing Tool Break and Touch Detector Optimized for Machining Conditions" and Ser. No. 943,397, filed Dec. 19, 1986, now U.S. Pat. No. 4,764,760, J. F. Bedard et al, "Automatic Gain Control for Machine Tool Monitor". The latter has a hardware AGC. A software controlled AGC for a worn tool detector is in U.S. Pat. No. 4,514,797.

SUMMARY OF THE INVENTION

An object of the invention is to do the calculation required for digital automatic gain control in much less time per sampling cycle than previously.

Another object is to provide a rapid method of digital automatic gain control and make possible its use in fast process control.

Yet another object is to provide, in a machine tool monitoring system, a real-time digital automatic gain control to keep a processed digital vibration signal within prescribed levels despite wide variations in the signal generated by a vibration sensor.

Fast digital automatic gain control is accomplished using only additions or subtractions and comparisons while not requiring time-consuming multiplications and divisions.

One implementation of the invention has a digitally programmable variable gain means in the analog signal channel and an analog-to-digital converter to sample and convert the analog output signal to digital values. The digital gain G which is input to the variable gain means is adjusted periodically to keep the long-term average value of the digitized output signal X at a desired average signal level L. Let T be the preselected time constant for exponential averaging, expressed in sampling period units. Then G is adjusted periodically to keep the exponential average of digital output signal X at the desired level L.

The rapid method of digital automatic gain control comprises determining and storing in the computer the integer constants N, NT, L, −NT and −L, where L and T are selected and the others computed, and N is the smallest integer such that NT is greater than or equal to the given maximum value of gain. Arbitrary variables A and B are set to an initial value; A is the accumulated difference over a number of sampling periods between the output signal X and desired average output level L, and B changes by current gain G when the magnitude of A becomes larger than L. In each sampling period there is added to A the difference between the current digitized output signal X and the desired average output level L. At this point there are three choices depending on the relative magnitudes of A and L. Variable A is often between L and −L in which case there is no action to adjust gain G and variable B. When the output signal X has been high for some time, above the desired average level L, and variable A becomes greater than L, A is decremented by L to bring A back to range and B is incremented by the current gain G. If variable B is now greater than NT then gain G is decreased by N and B is decreased by NT, and this repeated until variable B is not greater than NT. On the other hand, if the output signal X has been small for a sufficient length of time, below the desired average level L, and A becomes less than −L, the corresponding changes in A and B are made in the opposite direction. The tests on variable A are now repeated as just described until A falls in the range −L to L. Since A is not often outside the range −2L to 2L, the last procedure will usually be executed only once per cycle. The values of variables A and B and of gain G are retained for use in the next cycle, and the current gain G is presented to the variable gain means.

The preferred embodiment is real-time digital automatic gain control in the Machine Tool Monitor where the controlled process variable is the vibration signal. It is equally applicable to other types of digital process control requiring automatic regulation of the long-term average of a process variable through use of a multiplicative control parameter.

DETAILED DESCRIPTION OF THE INVENTION

Figure 1:
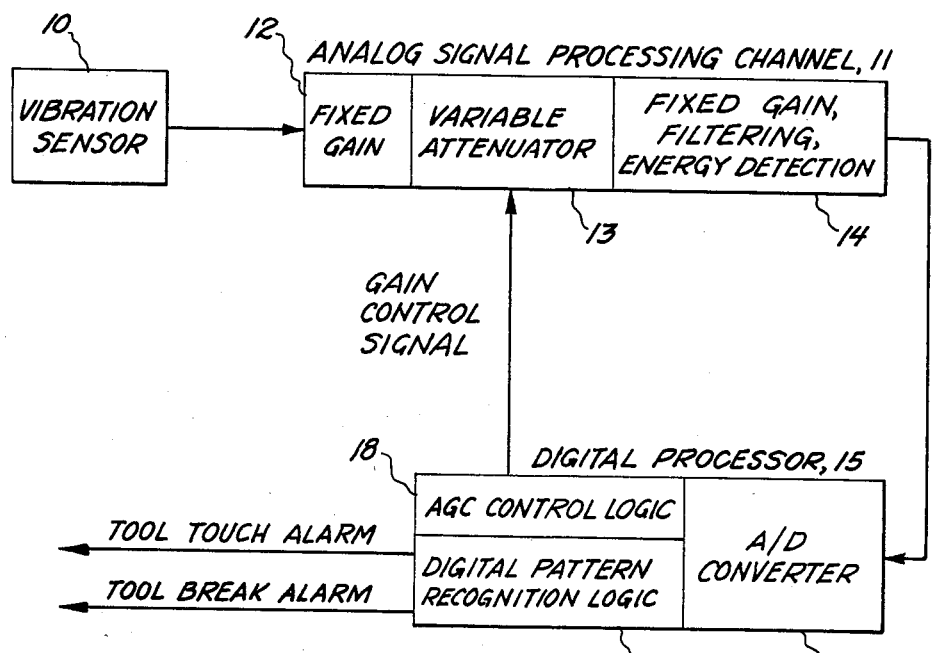
FIG. 1 is a system block diagram of a tool break and tool touch detector which has a digital automatic gain control to vary gain in the analog signal processing channel.

In FIG. 1, the Machine Tool Monitor is installed on a lathe, milling machine, or other machine tool and is integrated with the numerical control to allow automatic reaction to a broken tool and touch of the tool to a workpiece and to a vibrating reference post. The MTM is comprised of a vibration sensor 10 such as an accelerometer which is mounted on the machine tool in a location with good coupling to vibrations generated by interaction of the cutting tool with the workpiece. An analog signal processing channel 11 conditions the accelerometer signal to a low unipolar output voltage in a restricted frequency range and prepares it for analog-to-digital conversion. As shown in this figure, the sensor has associated with it a fixed gain 12. A gain control is provided capable of changing the gain of the channel over a large range under the control of the digital processor. The amplified sensor signal is presented to a variable attenuator 13 to keep signals within the dynamic range of the system. Thereafter the analog signal is passed to filtering and energy detection circuitry 14; there is a fixed gain associated with the filtering. Lower frequency machining noise below 30 KHz is filtered out and the Machine Tool Monitor does not use frequencies above 100 KHz as these are strongly attenuated unless the sensor is close to the tool holder. The energy detector is comprised of a full wave rectifier and a 500 Hz or less low pass anti-aliasing filter. The analog channel output signal is typically a 0 to 10 volt, dc to 500 Hz bandwidth signal. It is desirable, however, to maintain the average analog channel output level at approximately one volt even though there are wide variations in the input signal level due to process cutting changes such as depth of cut, different tool-workpiece combinations, etc.

The first part of digital processor 15 is an analog-to-digital converter 16 which samples and digitizes the analog channel output waveform. Digital pattern recognition logic 17 analyzes the amplitude of the samples and generates a tool break alarm whenever it detects a tool break acoustic signature characteristic of a significant break event that is likely to damage the tool or workpiece or force a re-cut. If operating in the tool touch detection mode, signal patterns associated with the first light rubbing contact with the workpiece are detected and a tool touch alarm is generated. Digital processor 15 is further comprised of AGC control logic 18 which receives the digitized samples and provides a gain control signal to variable attenuator 13. The gain is adjusted continually and automatically to keep the long-term average of the digitized analog channel output signal at a desired signal level such as approximately one volt. The AGC control logic of this invention operates rapidly and does not require division and multiplication in order to calculate a new value of gain during each sampling period.

Figure 2:
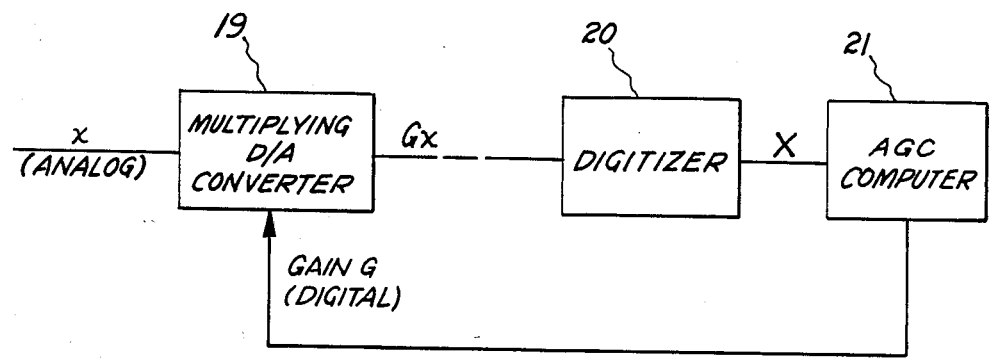
FIG. 2 is a simplified diagram of the digital AGC loop.

FIG. 2 shows the digital AGC loop. The variable attenuator is typically a digitally programmable multiplying digital-to-analog converter 19 whose gain is adjusted by setting its binary inputs via signals from the AGC computer 21. The MDAC has an analog input x, a digital input G, and an analog output proportional to the product Gx of the two inputs. If the analog input signal is held constant, the effect is to convert G to an analog signal. However in the computation considered here, the analog input x is a signal that represents a process variable, the vibration signal, and G is set so as to adjust the level of the output. The analog output is sampled at a suitable rate and converted to a digital value X by the independent digitizer 20. The gain control input G can be set to any integer value in a range permitted by the MDAC design. One commercially available MDAC can produce a relative gain factor of any integer from 1 to 1023.

The object of digital automatic gain control is to adjust G continually and automatically to keep the long-term average value of X at a desired level. Let L be an integer constant that is the desired level of the long-term average of X. Let T be a positive integer constant representing the desired length of the "long term", or more precisely, the desired time constant for exponential averaging, expressed in units of the sampling period. Then the object is to adjust G periodically to keep the exponential average of X (with time-constant T) at level L.

The rapid method of digital automatic gain control and of adjusting gain G is as follows. It is implemented with additions and subtractions and there are no multiplications and divisions. Let N be the smallest integer such that the product NT is greater than or equal to the maximum permitted value of G. If T is greater than or equal to the maximum of G, N is unity. Arbitrary integer variable A is defined as the accumulated difference over a number of sampling periods between the output signal X and the desired average output level L. Arbitrary integer variable B changes by current gain G when the magnitude of A becomes larger than L; gain G is changed by N when the magnitude of B becomes larger than NT. Variable A changes at every cycle while B does not change at regular intervals or at each cycle. The values of the constants N, NT, L, −NT and −L are assigned and stored at the beginning of the process; constants L and T are selected and the others are computed. In the machine tool monitoring system illustrated in FIG. 1, typical values are that gain is a positive integer less than 1024, and the time constant is a positive integer between 100 and 1,000. The time constant is user-chosen and in the range of, say, 0.1 sec to 3.6 sec; with an A/D converter having a sampling rate of 2000/sec, the time constant expressed in sampling periods would be 200 to 7200. The given constant N is the smallest amount by which gain is changed; if the time constant is short one will want to change gain quickly. At a time of 200, using $NT \geq G_{max}$, N is 6; at a time constant greater than 1024, N is 1. The digitized channel output signals are positive integers less than 4096 (10 millivolts per unit). The desired average output signal level L is 1 volt corresponding to 100 in the computer. All other variables are 2-byte integers having values between −32768 and +32768.

Figure 3:
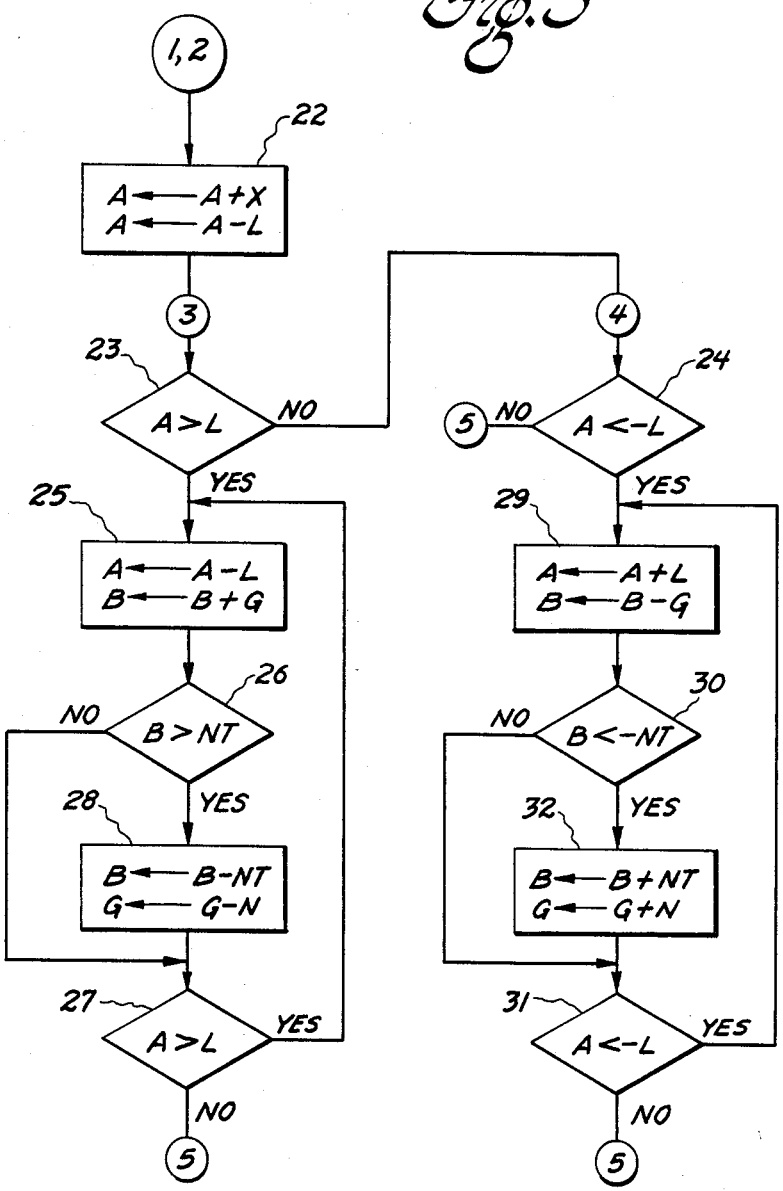
FIG. 3 is a flowchart of the AGC control logic showing the method of determining gain in each sampling cycle.

The program flowchart to determine a new value of gain G in each sampling period, 2000 times per second in the example given, is seen in FIG. 3. Initially variables A and B are set to zero or another initial value and a warmup period is needed The five major steps in the algorithm are designated by circled numbers. Standard steps 1 and 2 shown in block 22 are to increment variable A by the current digitized output signal X, and decrement A by the desired average output level L. That is, there is added to variable A the difference between the current digitized output signal X and the desired average level L. When the magnitude of the output signal X has been such that variable A is between L and −L (see FIG. 4), no action is taken to adjust the current gain G. Thus blocks 23 and 24 in the flowchart show that if A is not greater than L and A is not less than −L, go immediately to step 5. The current value of gain G is presented to the MDAC, and the values of variables A and B and gain G are retained for use in the next cycle.

Figure 4:
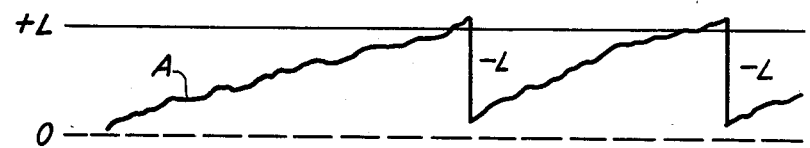
FIGS. 4 and 5 respectively show the variables A and B over a large number of sampling cycles as they are adjusted by the control logic to stay within a prescribed range.
Figure 4:
Figure 5:
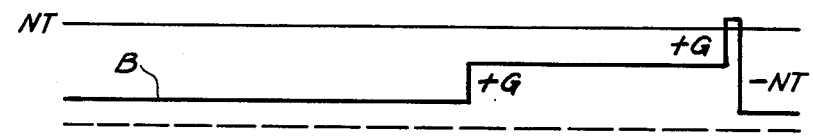
Figure 5:
Figure 6:
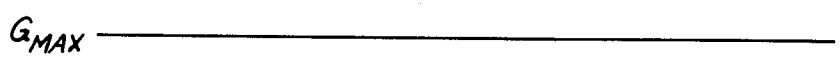
FIG. 6 shows the adjustment of gain for the example given in the preceding figures
Figure 6:
Figure 6:

It is seen that when the input signal is too high for some time, variable A will increase, and if it is too low variable A will decrease. Assume that the digitized output signal X has been large for a sufficient time, above the desired average output level L. At blocks 22 and 23, variable A is increased and A is now greater than L. Step 3 is followed and, referring to FIGS. 3–6, L is subtracted from A and the current gain G is added to variable B as indicated in block 25. If variable B is not greater than NT and variable A is not greater than the desired average output level L (blocks 26 and 27), proceed immediately to the fifth step. The gain G is unchanged and variables A and B have new values as is seen in FIGS. 4–6. When at block 26 variable B is now greater than the product NT, the gain G is reduced and a further change is made in variable B. The latter is decremented by NT and gain is decremented by N (block 28 and FIGS. 4–6). Ordinarily at block 27 variable A is not greater than the desired average output level L, but in the event L is greater than A, the instructions in blocks 25 and 26 are repeated and block 28 if necessary in order to return variable A to the convenient range.

The procedures given under step 4 are followed when the channel output signal X has been small for a sufficient time, below the desired average signal level L. At block 22 the magnitude of the digitized channel output signal X is such that variable A is increased only a small amount and decremented by the considerably larger desired average output level L. Therefore A decreases and if the new A is now less than −L, variables A and B are changed and the gain G may be increased. As shown in blocks 29 and 30, A is incremented by L and B is decremented by G, and if the variable B is not less than −NT and A is not less than −L, step 5 is carried out. There has been no change in gain and variables A and B have new values. At block 30 if B is now less than −NT, increment B by NT and increment G by N (block 32). In the event variable A is still less than −L, the procedures in blocks 29, 30 and 31, or blocks 29, 30, 32 and 31, are repeated until A is back to the proper range. At step 5 there is a new value of gain and variables A and B have been adjusted.

The entire procedure to determine a new value of gain G in each sampling cycle is reviewed in the following table:
1. Increment A by X.
2. Decrement A by L.
3. If A is now greater than L,
   a. Decrement A by L.
   b. Increment B by G.
   c. If B is now greater than N*T,
      (1) Decrement B by N*T.
      (2) Decrement G by N.
   d. If A is still greater than L, go to Step 3a; otherwise jump to step 5.
4. If A is now less than −L,
   a. Increment A by L.
   b. Decrement B by G.
   c. If B is now less than −N*T,
      (1) Increment B by N*T.
      (2) Increment G by N.
   d. If A is still less than −L, go to Step 4a; otherwise continue to step 5.
5. Return the value of G, retaining the values of A, B, and G for use in the next cycle.
(End of calculation.)

In the typical application in which the average of the signal does not often change greatly in the period of one time constant, steps 3a through 3d (or 4a through 4d) will usually be executed either not at all (if A lies in the range −L to L) or only once per cycle since A will not often stray outside the range −2L to 2L.

In the typical application, therefore, the longest path often taken is through steps 1, 2, 3, 4, 4a, 4b, 4c, 4c(1), 4c(2), 4d and 5. This path requires six additions/subtractions and four comparisons.

A variable gain electronic amplifier or indeed any digitally programmable variable gain device may be substituted for the multiplying digital-to-analog converter. Moreover, the interval at which the above calculation and procedure are performed periodically may be a multiple of the A/D converter sampling period or some other designated interval.

The automatic control of the average level of a vibration signal in the Machine Tool Monitor is only one application of the rapid method of digital AGC. It is applicable to any kind of digital process control in which the long-term average of a process variable is regulated through use of a multiplicative control parameter.

Various aspects of the Machine Tool Monitor are covered by issued patents, tool touch detection in U.S. Pat. No. 4,631,683 and tool break detection in U.S. Pat. Nos. 4,636,779, 4,636,780, and 4,642,617, the disclosures of which are incorporated by reference.

While the invention has been particularly shown and described with reference to a preferred embodiment, the foregoing and other changes in form and details may be made without departing from the spirit and scope of the invention.

The invention claimed is:

1. A rapid method of digital automatic gain control in a signal channel having a digitally programmable variable attenuator that adjusts gain and an analog-to-digital converter to sample the channel output and convert signal samples to digital values, comprising the steps of:
   (a) providing to an automatic gain control computer the digitized output signal X whose exponential average with time constant T is to be kept at a desired signal level L by adjusting the gain G presented to said variable attenuator;
(b) determining and storing the integer constants N, NT, L, −NT and −L where L and T are selected and the others computed, and N is the smallest integer such that NT is greater than or equal to a given maximum value of gain;
(c) setting arbitrary variables A and B to initial values, where A is an accumulated difference over a plurality of sampling periods between the output signal X and desired output signal level L and B changes by the current gain G when he magnitude of A becomes larger than L;
(d) in each sampling period, adding to A the difference between the current digitized output signal X and the desired average level L, and
  (i) when A is between L and −L, taking no further action to adjust current gain G;
  (ii) when the output signal X has been large for sufficient time above the desired average signal level, and A becomes larger than L, decrementing A by L and incrementing B and G, and decreasing current gain G only if B is now greater than NT;
  (iii) when the output signal X has been small for sufficient time, below the desired signal level L, and A becomes less than −L, incrementing A by L and decrementing B by G, and increasing current gain G only if B is now less than −NT; and
(e) retaining the values of A, B and G for use in the next sampling period and passing the current gain G to said variable attenuator.

2. The method of claim 1 further comprising, in step (dii), comparing A to L and repeating as needed until A is less than L.

3. The method of claim 1 further comprising, in step (diii), comparing A to −L and repeating as needed until A is greater than −L.

4. The method of claim 1 further comprising, in steps (dii) and (diii), adjusting gain G by N.

5. A rapid method of digital automatic gain control to cyclically adjust the gain of a signal channel having an analog input signal x and digitized output signal X so as to maintain the exponential average of the output signal X with a time constant T at a desired average signal level L, comprising the steps of:
(a) determining and storing in a computer the constants N, NT, L, NT and −L, where L and T are given and N is the smallest amount by which gain is changed and the smallest integer such that NT is greater than or equal to a given maximum digital gain $G_{max}$;
(b) setting arbitrary variables A and B to initial values, where A is the accumulated difference over a plurality of sampling cycles between the output signal X and the desired average output level L, and B changes by current gain G when the magnitude of A becomes larger than L;
(c) in each cycle, adding to A the difference between the current digitized output signal X and the desired average level L, and taking no action to change B and G when A is between L and −L; and
(d) retaining the values of A, B and G for use in the next cycle and presenting the current gain G to digitally programmable variable gain means in said signal channel.

6. The method of claim 5 further comprising, in step (c), determining that A is greater than L, decrementing A by L and incrementing B by G, determining that B is not greater than NT and A is not greater than L, and proceeding to step (d).

7. The method of claim 5 further comprising, in step (c), determining that A is greater than L, decrementing A by L and incrementing B by G, determining that B is now greater than NT, decrementing B by NT and decrementing G by N, and proceeding to step (d) after confirming that A is not greater than L.

8. The method of claim 7 further comprising, when A is still greater than L, repeating step (c) as needed until A is less than L.

9. The method of claim 5 further comprising, in step (c), determining that A is less than −L, incrementing A by L and decrementing B by G, determining that B is not less than −NT and that A is not less than −L, and proceeding to step (d).

10. The method of claim 5 further comprising, in step (c), determining that A is less than −L, incrementing A by L and decrementing B by G, determining that B is now less than −NT, incrementing B by NT and incrementing G by N, and proceeding to step (d) after confirming that A is not less than −L.

11. The method of claim 10 further comprising, when A is still less than −L, repeating step (c) as needed until A is not less than −L.

12. The method of claim 5 wherein said sampling cycles correspond to sampling periods of an analog-to-digital converter which presents said digitized output signals to said computer.

13. A rapid method of digital automatic gain control in a machine tool monitor having a vibration sensor to provide a signal representative of vibrations generated by interaction of a cutting tool and workpiece, an analog signal processing channel to condition the vibration signal to an analog output voltage in a restricted frequency range to an analog output voltage in a restricted frequency range and which has a digitally programmable variable attenuator that adjusts gain, and means to sample and convert the analog output to a digitized output signal X which is analyzed by a computer that calculates digital gain G, said method adjusting at every sampling period the digital gain G presented to said variable attenuator by said computer in order to maintain the exponential average of the digitized output signal X with a time constant T at a desired signal level L, comprising the steps of:
(a) determining and storing in said computer the constants N, NT, L, −NT and −L, where L and T are given and equal to a given maximum gain $G_{max}$;
(b) setting arbitrary variables A and B to initial values, where A is the accumulated difference over a plurality of sampling periods between the output signal X and the desired average output level L, and B changes by current gain G when the magnitude of A becomes larger than L;
(c) in each sampling period, adding to A the difference between the current digitized output signal X and the desired average level L, and
  (i) when A is between L and −L, taking no further action to adjust current gain G;
  (ii) when A is greater than L, decrementing A by L and incrementing B by G, and decreasing current gain G only if B is now greater than NT;

(iii) when A is less than −L, incrementing A by L, and decrementing B by G, and increasing current gain G only if B is now less than −NT; and (d) retaining the values of A, B and G for use in the next sampling period and presenting the current gain G to said variable attenuator.

14. The method of claim 13 further comprising, in steps (cii) and (ciii), adjusting G by N.

15. The method of claim 13 further comprising, in step (cii), decrementing B by NT and decreasing current gain by decrementing G by N.

16. The method of claim 13 further comprising, in step (ciii), incrementing B by NT and increasing current gain by incrementing G by N.

* * * * *

UNITED STATES PATENT AND TRADEMARK OFFICE
CERTIFICATE OF CORRECTION

PATENT NO.   : 4,807,167
DATED        : February 21, 1989
INVENTOR(S)  : Ben Arthur Green, Jr.

It is certified that error appears in the above-identified patent and that said Letters Patent is hereby corrected as shown below:

Column 5, line 46, "but in the event L is greater than A," should read -- but in the event A is greater than L, --

Claim 13, line 40, cancel "to an output analog voltage in a restricted frequency range"; line 53, before "equal" insert -- N is the smallest integer such that NT is greater than or --

Signed and Sealed this

Twenty-ninth Day of August, 1989

Attest:

DONALD J. QUIGG

Attesting Officer

Commissioner of Patents and Trademarks